US010892717B2

(12) United States Patent
    Lin

(10) Patent No.: US 10,892,717 B2
(45) Date of Patent: Jan. 12, 2021

(54) HIGHLY LINEAR TRANSCONDUCTANCE AMPLIFIER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 6 days.

(21) Appl. No.: 16/292,425

(22) Filed: Mar. 5, 2019

(65) Prior Publication Data

US 2020/0287506 A1  Sep. 10, 2020

(51) Int. Cl.
    *H03F 3/45* (2006.01)
    *H03F 1/32* (2006.01)
(52) U.S. Cl.
    CPC ....... *H03F 1/3211* (2013.01); *H03F 3/45197* (2013.01); *H03F 2203/45022* (2013.01)
(58) Field of Classification Search
    CPC ..... H03F 3/45; H03F 3/45008; H03F 3/45179
    USPC .................................................. 330/253, 283
    See application file for complete search history.

(56) References Cited

U.S. PATENT DOCUMENTS

| 5,463,348 | A | * | 10/1995 | Sarpeshkar | ........... H03F 1/3211 |
|           |   |   |         |            | 330/253 |
| 6,414,547 | B1 |   | 7/2002 | Shkap |  |
| 7,301,489 | B2 |   | 11/2007 | Lin |  |
| 2015/0015307 | A1 |   | 1/2015 | Shu |  |
| 2019/0379340 | A1 | * | 12/2019 | Rattan | ...................... H03G 5/28 |

FOREIGN PATENT DOCUMENTS

TW   200721701 A1   6/2007

OTHER PUBLICATIONS

TW Office Action dated Oct. 18, 2019, Taiwan Application No. 108127705, pp. 1-6.

* cited by examiner

*Primary Examiner* — Steven J Mottola
(74) *Attorney, Agent, or Firm* — McClure, Qualey & Rodack, LLP

(57) ABSTRACT

A circuit includes a first common-source amplifier configured to receive a first voltage at a first gate node and output a first current to a first drain node in accordance with a first source voltage at a first source node; a second common-source amplifier configured to receive a second voltage at a second gate node and output a second current to a second drain node in accordance with a second source voltage at a second source node; a first diode-connected device configured to couple the first source node to a DC (direct current) node; a second diode-connected device configured to couple the second source node to the DC node; and a source-degenerating resistor inserted between the first source node and the second source node.

10 Claims, 4 Drawing Sheets

HIGHLY LINEAR TRANSCONDUCTANCE AMPLIFIER AND METHOD THEREOF

BACKGROUND OF THE DISCLOSURE

Field of the Invention

The present invention generally relates to transconductance amplifiers, and more particularly to transconductance amplifiers that allow high linearity without having a large parasitic capacitance.

Description of Related Art

Conventional transconductance amplifiers receive a voltage signal and output a current signal accordingly. Ideally, an incremental change of the voltage signal will lead to a proportionally incremental change of the current signal. In a differential-signaling embodiment, a voltage signal comprises a first voltage and a second voltage, while a current signal comprises a first current and a second current. As depicted in FIG. 1, a prior art transconductance amplifier 100 in a differential-signaling embodiment comprises: a first NMOS (n-channel metal oxide semiconductor) transistor 111 configured to receive a first voltage $V_p$ and output a first current $I_p$, and a second NMOS transistor 112 configured to receive a second voltage $V_n$ and output a second current $I_n$. Here, $V_p$ and $V_n$ jointly define a voltage signal, and $I_p$ and $I_n$ jointly define a current signal. $I_p$ and $I_n$ are received by a load 120, which comprises a first resistor 121 and a second resistor 122 configured to receive $I_p$ and $I_n$, respectively. Throughout this disclosure, "$V_{DD}$" denotes a power supply node.

An issue of prior art transconductance amplifiers, like transconductance amplifier 100 is that the linearity is usually not good, unless the two NMOS transistors 111 and 112 have a long channel length. Using a long channel length for the two NMOS transistors 111 and 112, however, leads a large parasitic capacitance, and adversely limits the speed of the transconductance amplifier 100.

Therefore, what is desired is a transconductance amplifier that allows high linearity without having a large parasitic capacitance.

BRIEF SUMMARY OF THIS INVENTION

In an embodiment, a circuit comprises: a first common-source amplifier configured to receive a first voltage at a first gate node and output a first current to a first drain node in accordance with a first source voltage at a first source node; a second common-source amplifier configured to receive a second voltage at a second gate node and output a second current to a second drain node in accordance with a second source voltage at a second source node; a first diode-connected device configured to couple the first source node to a DC (direct current) node; a second diode-connected device configured to couple the second source node to the DC node; and a source-degenerating resistor inserted between the first source node and the second source node.

In an embodiment, a method comprises: utilizing a first common-source amplifier to receive a first voltage at a first gate node and output a first current to a first drain node in accordance with a first source voltage at a first source node; utilizing a second common-source amplifier to receive a second voltage at a second gate node and output a second current to a second drain node in accordance with a second source voltage at a second source node; coupling the first source node to a DC (direct current) node using a first diode-connected device; coupling the second source node to the DC node using a second diode-connected device; and coupling the first source node to the second source node using a source-degenerating resistor.

DETAILED DESCRIPTION OF THIS DISCLOSURE

The present invention relates to transconductance amplifiers. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "(circuit) node," "signal," "voltage," "current," "DC (direct current)," "transconductance," "amplifier," "differential signal," "parasitic capacitance," "resistor," "CMOS (complementary metal oxide semiconductor)," "PMOS (P-channel metal oxide semiconductor) transistor," "NMOS (N-channel metal oxide semiconductor) transistor," "channel length," "impedance," "common-source amplifier," and "source degeneration." Terms and basic concepts like these are apparent to those of ordinary skill in the art and thus will not be explained in detail here. Those of ordinary skill in the art can also recognize symbols of PMOS transistor and NMOS transistor, and identify the "source," the "gate," and the "drain" terminals thereof.

The present disclosure is presented from an engineering perspective. For instance, "X is equal to Y" means: "a difference between X and Y is smaller than a specified engineering tolerance." "X is substantially smaller than Y" means: "a ratio between X and Y is smaller than a specified engineering tolerance."

Throughout this disclosure, differential signaling is used, wherein a voltage signal comprises a first voltage and a second voltage, while a current signal comprises a first current and a second current.

Figure 1:
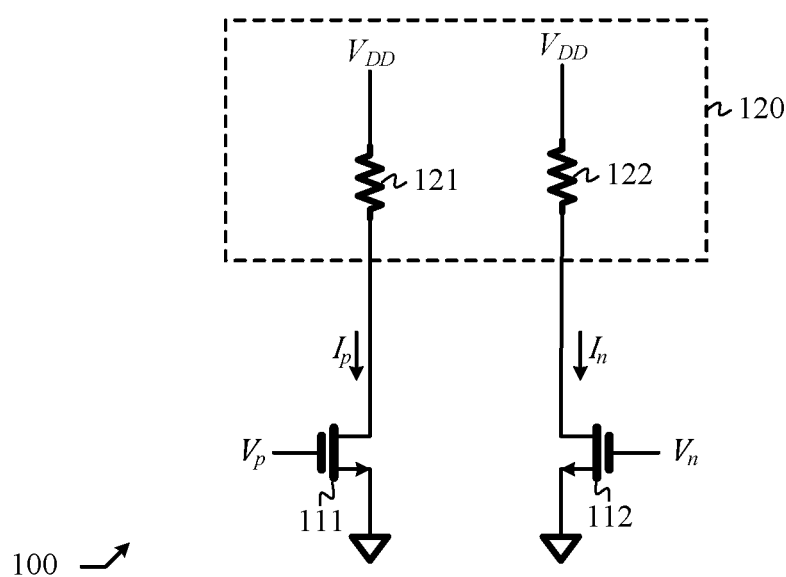
FIG. 1 shows a schematic diagram of a prior art transconductance amplifier.
Figure 2A:
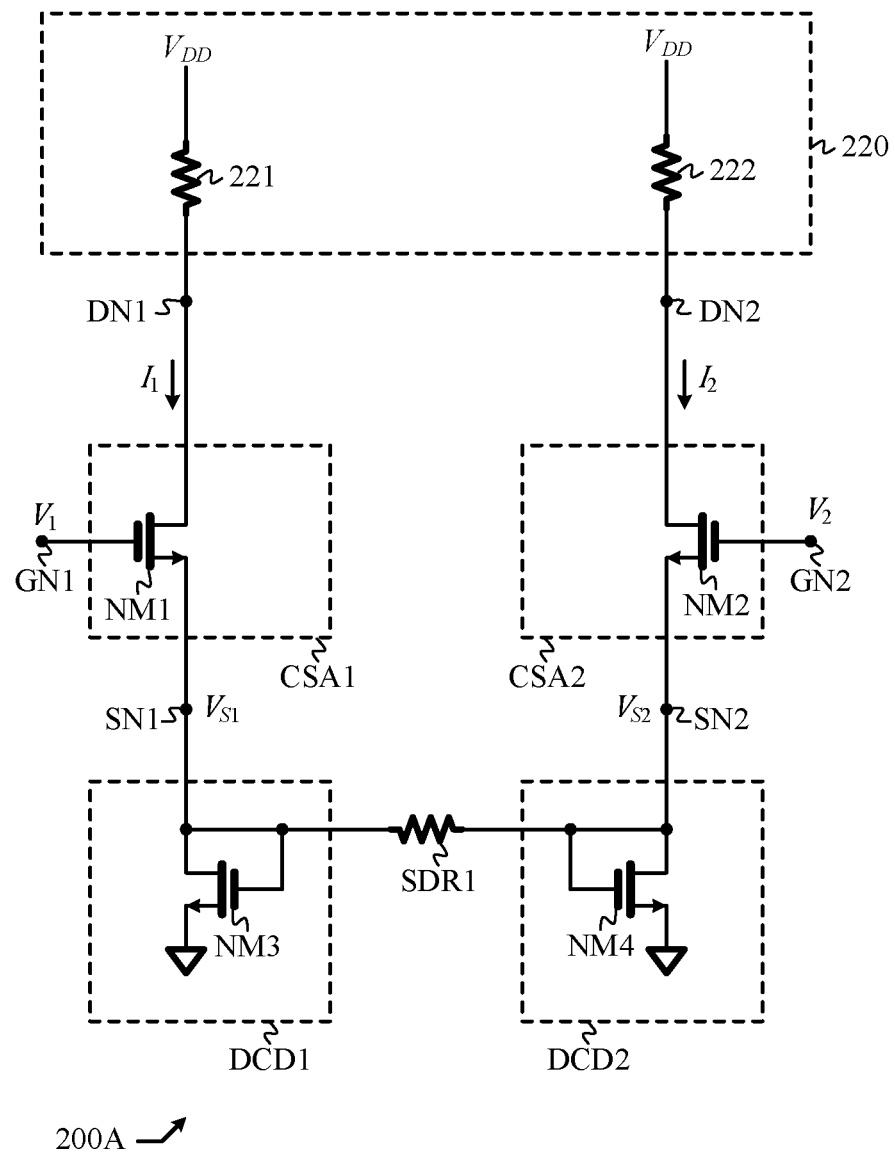
FIG. 2A shows a schematic diagram of a transconductance amplifier in accordance with an embodiment of the present invention.

A schematic diagram of a circuit 200A in accordance with an embodiment of the present invention is shown in FIG. 2A. Circuit 200A comprises: a first common-source amplifier CSA1 comprising a first NMOS (n-channel metal oxide semiconductor) transistor NM1, a second common-source amplifier CSA2 comprising a second NMOS transistor NM2, a first diode-connected device DCD1 comprising a third NMOS transistor NM3 configured in a diode-connected topology, a second diode-connected device DCD2 comprising a fourth NMOS transistor NM4 configured in a diode-connected topology, and a source-degenerating resistor SDR1. The source, the gate, and the drain of NMOS transistor NM1 connect to a first source node SN1, a first gate node GN1, and a first drain node DN1, respectively; the source, the gate, and the drain of NMOS transistor NM2 connect to a second source node SN2, a second gate node GN2, and a second drain node DN2, respectively; the source and the drain of NMOS transistor NM3 connect to ground and the first source node SN1, respectively; the source and the drain of NMOS transistor NM4 connect to ground and the second source node SN2, respectively; and the source-degenerating resistor SDR1 is placed between the first source node SN1 and the second source node SN2.

In the illustrated embodiment, a diode-connected device is a MOS (metal-oxide semiconductor) device configured in a topology, wherein its gate and drain are connected. The first common-source amplifier CSA1 receives a first voltage $V_1$ at the first gate node GN1 and output a first current $I_1$ to the first drain node DN1 in accordance with a source degeneration provided by a first source voltage $V_{S1}$ at the first source node SN1. The second common-source amplifier CSA2 receives a second voltage $V_2$ at the second gate node GN2 and output a second current $I_2$ to the second drain node DN2 in accordance with a source degeneration provided by a second source voltage $V_{S2}$ at the second source node SN2. The first diode-connected device DCD1 causes the first source node SN1 to have a finite impedance to fulfill a source degeneration function to linearize the first common-source amplifier CSA1, while the second diode-connected device DCD2 causes the second source node SN2 to have a finite impedance to fulfill a source degeneration function to linearize the second common-source amplifier CSA2. When the first voltage $V_1$ rises (falls), the first NMOS transistor NM1 will conduct more (less) current and thus lead to an increase (decrease) of the first current $I_1$, causing the first source voltage $V_{S1}$ to rise (fall) and thus alleviating the increase (decrease) of the first current $I_1$. This helps to improve linearity of the first common-source amplifier CSA1. The same thing can be said about the second common-source amplifier CSA2.

As a result, the first NMOS transistor NM1 and the second NMOS transistor NM2 do not need to have a long channel length and thus a large parasitic capacitance, yet the first common-source amplifier CSA1 and the second common-source amplifier CSA2 can still have high linearity. However, when $V_{S1}$ ($V_{S2}$) is higher, an impedance of the first (second) diode-connected device DCD1 (DCD2) becomes smaller, causing the source degeneration provided by the first (second) diode-connected device DCD1 (DCD2) to be less effective. To address this issue, the source-degenerating resistor SDR1 is introduced. The source-degenerating resistor SDR1 provides a shunt path between the first source node SN1 and the second source node SN2, thus preventing $V_{S1}$ or $V_{S2}$ from becoming too high, thus preventing the source-degeneration provided by the first diode-connected device DCD1 or a second diode-connected device DCD2 from becoming ineffective.

The circuit 200A further comprises a load 220 configured to receive the first current $I_1$ and the second current $I_2$ via the first drain node DN1 and the second drain node DN2, respectively. By way of example but not limitation, the load 220 comprises a first load resistor 221 and a second load resistor 222 configured to receive the first current $I_1$ and the second current $I_2$ via the first drain node DN1 and the second drain node DN2, respectively. Throughout this disclosure, "$V_{DD}$" denotes a power supply node.

Figure 2B:
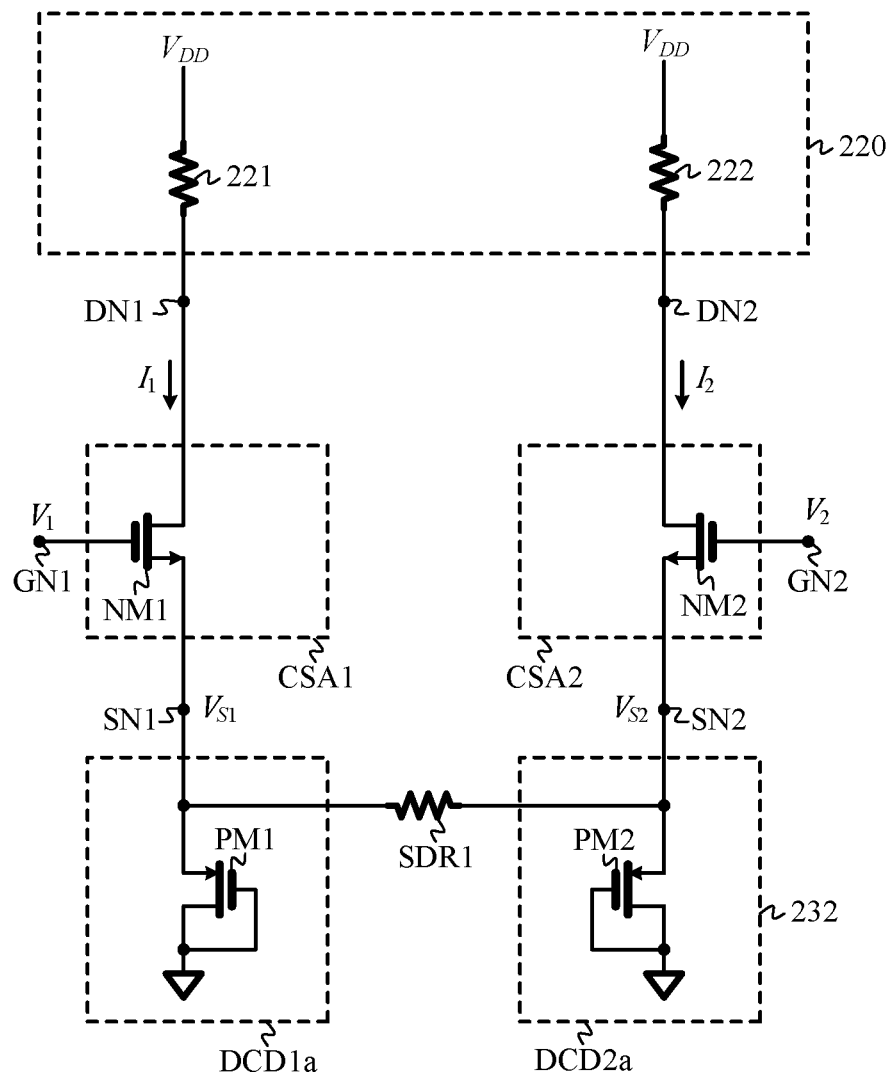
FIG. 2B shows a schematic diagram of an alternative embodiment of the transconductance amplifier of FIG. 2A.

A schematic diagram of an alternative circuit 200B in accordance with an alternative embodiment of the present invention is shown in FIG. 2B. The alternative circuit 200B is the same as the circuit 200A in FIG. 2A, except that the first diode-connected device DCD1 of the circuit 200A in FIG. 2A is replaced by a first alternative diode-connected device DCD1a in FIG. 2B, while the second diode-connected device DCD2 of the circuit 200A in FIG. 2A is replaced by a second alternative diode-connected device DCD2a in FIG. 2B. The first alternative diode-connected device DCD1a comprises a first PMOS (p-channel metal oxide semiconductor) transistor PM1 configured in a diode-connected topology, while the second alternative diode-connected device DCD2a comprises a second PMOS transistor PM2 configured in a diode-connected topology. The source and drain of the first PMOS transistor PM1 connect to the first source node SN1 and ground, respectively; the source and drain of the second PMOS transistor PM2 connect to the second source node SN2 and ground, respectively.

Note that a power supply node, such as "$V_{DD}$," is considered a DC (direct current) node, since a voltage at a power supply node is substantially stationary and contains nearly zero AC (alternate current) component. A ground node is also a DC node, since a voltage at a ground node is substantially zero.

As far as functionality is concerned, any number of circuits comprising a plurality of MOS transistors and passive elements and working in a power domain across a power supply node and a ground node can be modified into an alternative circuit by replacing every NMOS transistor with a PMOS transistor, replacing every PMOS transistor with a NMOS transistor, and swapping the power supply node with the ground node. The alternative circuit has the same function as the original circuit. Persons skilled in the art can derive alternative embodiments based on this approach.

In this disclosure, a "diode-connected device" means a device connected or configured in a way such that it behaves like a diode. A diode-connected device could be (but is not limited to) a PMOS transistor, a NMOS transistor, a PNP bipolar junction transistor, or an NPN bipolar junction transistor. The principle of this disclosure, however, still holds if the "diode-connected device" is a true diode; in other words, a true diode is considered a special case of a "diode-connected device."

Figure 3:
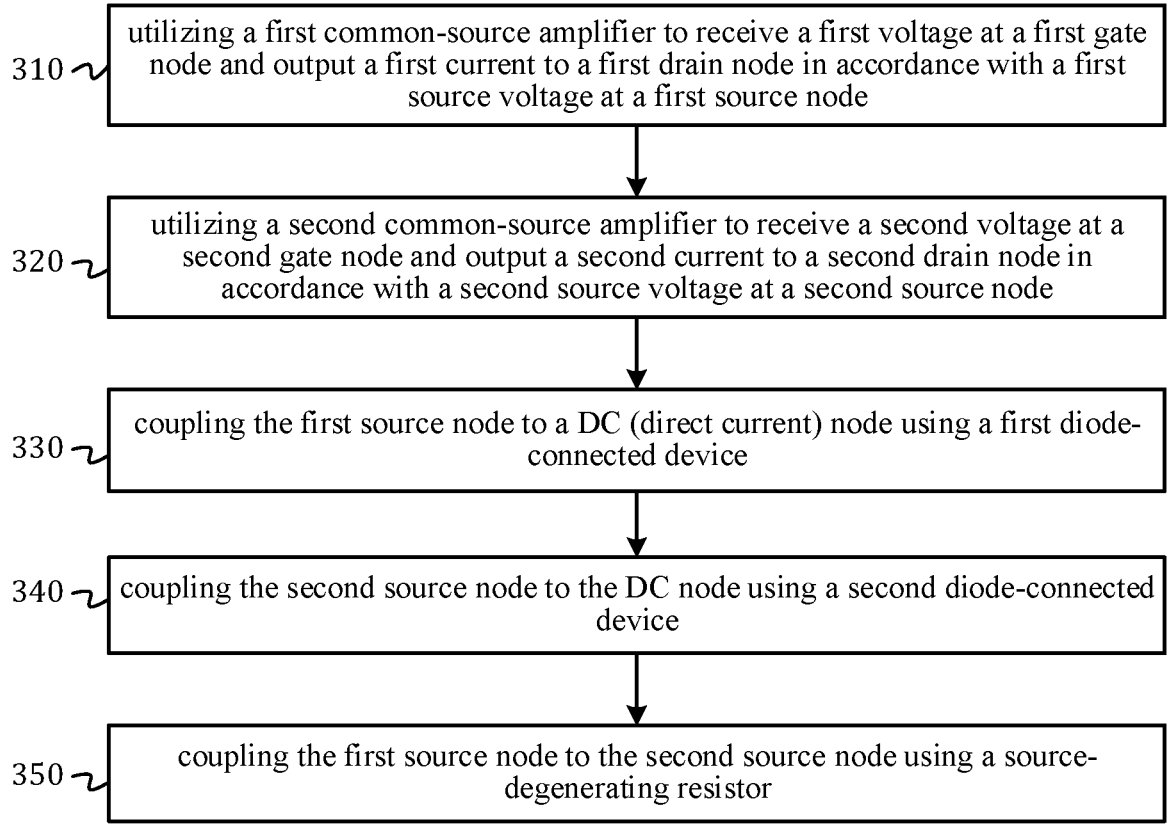
FIG. 3 shows a flow diagram of a method in accordance with an embodiment of the present invention.

As shown by a flow diagram 300 depicted in FIG. 3, a method in accordance with an embodiment of the present invention comprises: (step 310) utilizing a first common-source amplifier to receive a first voltage at a first gate node and output a first current to a first drain node in accordance with a first source voltage at a first source node; (step 320) utilizing a second common-source amplifier to receive a second voltage at a second gate node and output a second current to a second drain node in accordance with a second source voltage at a second source node; (step 330) coupling the first source node to a DC (direct current) node using a first diode-connected device; (step 340) coupling the second source node to the DC node using a second diode-connected device; and (step 350) coupling the first source node to the second source node using a source-degenerating resistor.

Those skilled in the art will readily observe that numerous modifications and alterations of the device and method may be made while retaining the teachings of the invention. Accordingly, the above disclosure should not be construed as limited only by the metes and bounds of the appended claims.

What is claimed is:

1. A circuit comprising:
a first common-source amplifier configured to receive a first voltage at a first gate node and receive a first current to a first drain node in accordance with a first source voltage at a first source node;
a second common-source amplifier configured to receive a second voltage at a second gate node and receive a second current to a second drain node in accordance with a second source voltage at a second source node;
a first diode-connected device having a third source node connected to the first source node, and a third drain node and a third gate node both connected to ground;
a second diode-connected device having a fourth source node connected to the second source node, and a fourth drain node and a fourth gate node both connected to ground; and
a source-degenerating resistor inserted between the third source node and the fourth source node.

2. The circuit of claim 1, wherein the first common-source amplifier comprises a first MOS (metal-oxide semiconductor) transistor of a first type, and the second common-source amplifier comprises a second MOS transistor of the first type.

3. The circuit of claim 2, wherein the first diode-connected device comprises a third MOS transistor of the first type, and the second diode-connected device comprises a fourth MOS transistor of the first type.

4. The circuit of claim 2, wherein the first diode-connected device comprises a first MOS transistor of a second type, and the second diode-connected device comprises a second MOS transistor of the second type.

5. The circuit of claim 1, wherein the first current and the second current are received by a load via the first drain node and the second drain node, respectively.

6. A method comprising:
utilizing a first common-source amplifier to receive a first voltage at a first gate node and receive a first current to a first drain node in accordance with a first source voltage at a first source node;
utilizing a second common-source amplifier to receive a second voltage at a second gate node and receive a second current to a second drain node in accordance with a second source voltage at a second source node;
using a first diode-connected device to couple a third source node to a DC (direct current) node, where the first diode-connected device has the third source node connected to the first source node, and a third drain node and a third gate node both connected to ground;
using a second diode-connected device to couple a fourth source node to a DC (direct current) node, where the second diode-connected device has the fourth source node connected to the second source node, and a fourth drain node and a fourth gate node both connected to ground; and
coupling the third source node to the fourth source node using a source-degenerating resistor.

7. The method of claim 6, wherein the first common-source amplifier comprises a first MOS (metal-oxide semiconductor) transistor of a first type, and the second common-source amplifier comprises a second MOS transistor of the first type.

8. The method of claim 7, wherein the first diode-connected device comprises a third MOS transistor of the first type, and the second diode-connected device comprises a fourth MOS transistor of the first type.

9. The method of claim 8, wherein the first diode-connected device comprises a first MOS transistor of a second type, and the second diode-connected device comprises a second MOS transistor of the second type.

10. The method of claim 9, wherein the first current and the second current are received by a load via the first drain node and the second drain node, respectively.

* * * * *